United States Patent
Okunaga

(10) Patent No.: US 10,812,044 B2
(45) Date of Patent: Oct. 20, 2020

(54) ACOUSTIC WAVE DEVICE, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Hiromu Okunaga, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/438,592

(22) Filed: Jun. 12, 2019

(65) Prior Publication Data

US 2019/0296715 A1  Sep. 26, 2019

Related U.S. Application Data

(63) Continuation of application No. PCT/JP2017/040358, filed on Nov. 9, 2017.

(30) Foreign Application Priority Data

Dec. 20, 2016 (JP) .................... 2016-246674

(51) Int. Cl.
*H03H 9/145* (2006.01)
*H03F 3/20* (2006.01)
(Continued)

(52) U.S. Cl.
CPC ............ *H03H 9/1457* (2013.01); *H03F 3/20* (2013.01); *H03H 3/08* (2013.01);
(Continued)

(58) Field of Classification Search
CPC .... H03H 9/1457; H03H 3/08; H03H 9/02559; H03H 9/02637; H03H 9/145; H03H 9/25;
(Continued)

(56) References Cited

U.S. PATENT DOCUMENTS

| | | |
|---|---|---|
| 2013/0051588 A1 | 2/2013 | Ruile et al. |
| 2013/0249647 A1 | 9/2013 | Nakanishi et al. |

(Continued)

FOREIGN PATENT DOCUMENTS

| | | |
|---|---|---|
| JP | 2013-518455 A | 5/2013 |
| JP | 2013-544041 A | 12/2013 |

(Continued)

OTHER PUBLICATIONS

Official Communication issued in International Patent Application No. PCT/JP2017/040358, dated Dec. 26, 2017.

*Primary Examiner* — Robert J Pascal
*Assistant Examiner* — Hafizur Rahman
(74) *Attorney, Agent, or Firm* — Keating & Bennett, LLP

(57) ABSTRACT

An acoustic wave device includes an IDT electrode provided on a piezoelectric substrate. The IDT electrode includes a crossing area including a central area, and first and second low-acoustic-velocity areas on both sides in a direction perpendicular or substantially perpendicular to an acoustic wave propagating direction. First and second high-acoustic-velocity areas are provided outside the first and second low-acoustic-velocity areas. Mass adding films are laminated in respective portions of first and second electrode fingers, the respective portions being positioned in the first and second low-acoustic-velocity areas. In at least one of the mass adding films, a width of a first end portion and a width of a second end portion are narrower than a width of a central portion, and a protruding portion protrudes from at least one of the first and second end portions.

20 Claims, 9 Drawing Sheets

(51) Int. Cl.
*H03H 3/08* (2006.01)
*H03H 9/02* (2006.01)
*H03H 9/25* (2006.01)
*H03H 9/72* (2006.01)
*H04B 1/40* (2015.01)

(52) U.S. Cl.
CPC .... *H03H 9/02559* (2013.01); *H03H 9/02637* (2013.01); *H03H 9/145* (2013.01); *H03H 9/25* (2013.01); *H03H 9/72* (2013.01); *H03H 9/725* (2013.01); *H04B 1/40* (2013.01); *H03F 2200/165* (2013.01); *H03F 2200/171* (2013.01); *H03F 2200/451* (2013.01)

(58) Field of Classification Search
CPC .. H03H 9/72; H03H 9/725; H03F 3/20; H03F 2200/165; H03F 2200/171; H03F 2200/451; H04B 1/40

USPC ........................................................ 333/192
See application file for complete search history.

(56) References Cited

U.S. PATENT DOCUMENTS

2014/0001919 A1  1/2014  Komatsu et al.
2016/0087187 A1* 3/2016  Burak .................. H01L 41/047
                                                    310/349
2017/0047905 A1  2/2017  Araki et al.

FOREIGN PATENT DOCUMENTS

JP    2016-026444 A    2/2016
JP    2016-178387 A   10/2016
WO    2015/182522 A1  12/2015

* cited by examiner

ACOUSTIC WAVE DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-246674 filed on Dec. 20, 2016 and is a Continuation Application of PCT Application No. PCT/JP2017/040358 filed on Nov. 9, 2017. The entire contents of each application are hereby incorporated herein by reference.

BACKGROUND OF THE INVENTION

Field of the Invention

The present invention relates to an acoustic wave device, a radio-frequency (RF) front-end circuit, and a communication apparatus which use a piston mode.

Description of the Related Art

There has been proposed an acoustic wave device using a piston mode in order to suppress unnecessary waves.

For example, Japanese Unexamined Patent Application Publication No. 2013-518455 below discusses an example acoustic wave device using a piston mode. This acoustic wave device includes an IDT electrode provided on a piezoelectric substrate. The IDT electrode includes a central excitation area positioned at the center in a direction in which electrode fingers extend, and inner-edge areas adjacent to both sides of the central excitation area in the electrode finger extending direction. The IDT electrode further includes outer-edge areas adjacent to the outer side of the inner-edge areas.

In the inner-edge areas, mass adding films made of dielectric or metal are laminated on the electrode fingers, and the width of the electrode fingers in the inner-edge areas is made wider. In doing so, the acoustic velocity in the inner-edge areas becomes slower than the acoustic velocity in the central excitation area and the outer-edge areas. In this manner, the inner-edge areas are low-acoustic-velocity areas. The outer-edge areas are high-acoustic-velocity areas where the acoustic velocity is faster than the central excitation area. By arranging the central excitation area, the low-acoustic-velocity areas, and the high-acoustic-velocity areas in this order, the energy of acoustic waves is enclosed and unnecessary waves are suppressed.

Because the method of laminating the above-mentioned mass adding films have no upper limit for designing the lamination thickness, a large mass can be added. Therefore, there is an advantage that the method has a high degree of freedom in designing the device. For this reason, attention has been paid to the technology of laminating mass adding films in the inner-edge areas.

In a piston mode, transverse mode waves excited in the central excitation area are cancelled out, but transverse mode waves excited in the low-acoustic-velocity areas remain without being cancelled out, which then become unnecessary waves. For this reason, it is generally desirable for the low-acoustic-velocity areas to have a narrow width. However, in the case where the slope of acoustic velocity at the boundary between a low-acoustic-velocity area and an acoustic area adjacent to the low-acoustic-velocity area is moderate, the width becomes broader in order to add an equivalent mass, resulting in new generation of unnecessary waves. For this reason, it is desirable at the boundary with the adjacent acoustic area to have a steep slope of acoustic velocity.

Specifically, when viewed in plan, in the case where the shape of the electrode fingers in the low-acoustic-velocity areas is rectangular, it is desirable that the planar shape of the mass adding films be ideally rectangular.

In addition, it is desirable that the cross-sectional shape along a direction in which first electrode fingers and second electrode fingers extend be ideally rectangular.

However, it is actually difficult for the first electrode fingers and the second electrode fingers to have such a shape. For example, even with the photolithography technology, the shape fidelity at a pattern end is degraded due to the influence of diffracted light and reflected light, and the corner portions of the planar shape of the mass adding films tend to be curved.

Furthermore, with a processing method such as lift-off technology or etching, the cross-sectional shape of the mass adding films tends to be a substantially trapezoid including lower base is longer than the upper base. For that reason, both end surfaces tend to incline with respect to the thickness direction. Therefore, there is a tendency that the slope of acoustic velocity between the low-acoustic-velocity areas and the high-acoustic-velocity areas and the slope of acoustic velocity between the low-acoustic-velocity areas and the central excitation area become moderate, and, in some cases, unnecessary waves are not sufficiently suppressed.

SUMMARY OF THE INVENTION

Preferred embodiments of the present invention provide acoustic wave devices, RF front-end circuits, and communication apparatuses, each capable of making a slope of acoustic velocity at a boundary between two areas with different acoustic velocities steeper, and effectively reducing or preventing unnecessary waves.

In an acoustic wave device according to a preferred embodiment of the present invention, the acoustic wave device includes a piezoelectric substance, and an IDT electrode provided on the piezoelectric substance. The IDT electrode includes a first busbar and a second busbar facing each other; a plurality of first electrode fingers including first ends connected to the first busbar; and a plurality of second electrode fingers including first ends connected to the second busbar, the plurality of second electrode fingers being interdigitated with the plurality of first electrode fingers. The IDT electrode includes a crossing area where the first electrode fingers and the second electrode fingers overlap each other in an acoustic wave propagating direction; and a first high-acoustic-velocity area and a second high-acoustic-velocity area. The crossing area includes a central area positioned on a center side in a direction orthogonal to the acoustic wave propagating direction; and a first low-acoustic-velocity area and a second low-acoustic-velocity area arranged on both sides in a direction orthogonal to the acoustic wave propagating direction of the central area, the first low-acoustic-velocity area and the second low-acoustic-velocity area having an acoustic velocity slower than that of the central area. The first high-acoustic-velocity area is an area that is positioned between the first busbar and the first low-acoustic-velocity area and that has an acoustic velocity faster than that of the central area. The second high-acoustic-velocity area is an area that is positioned between the second busbar and the second low-acoustic-velocity area and that has an acoustic velocity faster than that of the central area. Mass adding films are laminated in respective portions of the plurality of first electrode fingers and the plurality of second electrode fingers, the respective portions being positioned in the first low-acoustic-velocity area and the second low-acoustic-velocity area. Assuming that a direction in which each of the first electrode fingers extends is each first length direction and a direction in which each of the second electrode fingers extends is each second length direction, each of the mass adding films incudes a central portion positioned at center in the each first length direction or the each second length direction, and a first end portion and a second end portion positioned at both ends in the each first length direction or the each second length direction. Assuming that a dimension along the acoustic wave propagating direction of the mass adding films is a width, the width of the first end portion and the width of the second end portion are narrower than the width of the central portion in at least one of the mass adding films, and the at least one of the mass adding films includes a protruding portion that protrudes from at least one of the first end portion and the second end portion to a side opposite to the piezoelectric substance side.

In an acoustic wave device according to another preferred embodiment of the present invention, the acoustic wave device includes a piezoelectric substance, and an IDT electrode provided on the piezoelectric substance. The IDT electrode includes a first busbar and a second busbar facing each other; a plurality of first electrode fingers including first ends are connected to the first busbar; and a plurality of second electrode fingers including first ends are connected to the second busbar, the plurality of second electrode fingers being interdigitated with the plurality of first electrode fingers. The IDT electrode includes a crossing area where the first electrode fingers and the second electrode fingers overlap each other in an acoustic wave propagating direction; and a first high-acoustic-velocity area and a second high-acoustic-velocity area. The crossing area includes a central area positioned on a center side in a direction orthogonal to the acoustic wave propagating direction; and a first low-acoustic-velocity area and a second low-acoustic-velocity area arranged on both sides in a direction orthogonal to the acoustic wave propagating direction of the central area, the first low-acoustic-velocity area and the second low-acoustic-velocity area having an acoustic velocity slower than that of the central area. The first high-acoustic-velocity area is an area that is positioned between the first busbar and the first low-acoustic-velocity area and that has an acoustic velocity faster than that of the central area. The second high-acoustic-velocity area is an area that is positioned between the second busbar and the second low-acoustic-velocity area and that has an acoustic velocity faster than that of the central area. Mass adding films are laminated in respective portions of the plurality of first electrode fingers and the plurality of second electrode fingers, the respective portions being positioned in the first low-acoustic-velocity area and the second low-acoustic-velocity area. Assuming that a direction in which each of the first electrode fingers extends is each first length direction and a direction in which each of the second electrode fingers extends is each second length direction, each of the mass adding films incudes a central portion positioned at center in the each first length direction or the each second length direction, a first end portion and a second end portion positioned at both ends in the each first length direction or the each second length direction, a first end surface that is an end surface positioned in the first end portion, and a second end surface that is an end surface positioned in the second end portion. The first end surface and the second end surface of at least one of the mass adding films are inclined with respect to a thickness direction of the mass adding films, and the at least one of the mass adding films includes a protruding portion that protrudes from at least one of the first end portion and the second end portion to a side opposite to the piezoelectric substance side.

In an acoustic wave device according to a preferred embodiment of the present invention, assuming that an angle of inclination with respect to the thickness direction of the mass adding films is an inclination angle, the inclination angle of the protruding portion is less than the inclination angle of an end surface positioned in, out of the first end portion and the second end portion, an end portion where the protruding portion protrudes. In this case, the slope of acoustic velocity at the boundary between two areas with different acoustic velocities is able to be made even steeper, and unnecessary waves are able to be further reduced or prevented.

In an acoustic wave device according to another preferred embodiment of the present invention, all the mass adding films include the protruding portion. Accordingly, because the slope of acoustic velocity at the boundary between two areas with different acoustic velocities is able to be made even steeper, unnecessary waves are able to further reduced or prevented.

In an acoustic wave device according to an additional preferred embodiment of the present invention, the protruding portion is provided in both of the first end portion and the second end portion of the mass adding films. Accordingly, because the slope of acoustic velocity at both boundaries is able to be made steeper, unnecessary waves are able to be even more reduced or prevented.

A radio-frequency front-end circuit according to a preferred embodiment of the present invention includes an acoustic wave device according to a preferred embodiment of the present invention, and a power amplifier.

A communication apparatus according to a preferred embodiment of the present invention includes a radio-frequency front-end circuit according to a preferred embodiment of the present invention, and an RF signal processing circuit.

According to preferred embodiments of the present invention, acoustic wave devices, radio-frequency front-end circuits, and communication apparatuses capable of making the slope of acoustic velocity at the boundary between two areas with different acoustic velocities steeper, and effectively reducing or preventing unnecessary waves, are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing specific preferred embodiments of the present invention with reference to the drawings.

Note that preferred embodiments described in the present specification are example and it shall be noted that a partial replacement or combination of configurations in different preferred embodiments is possible.

Figure 1:
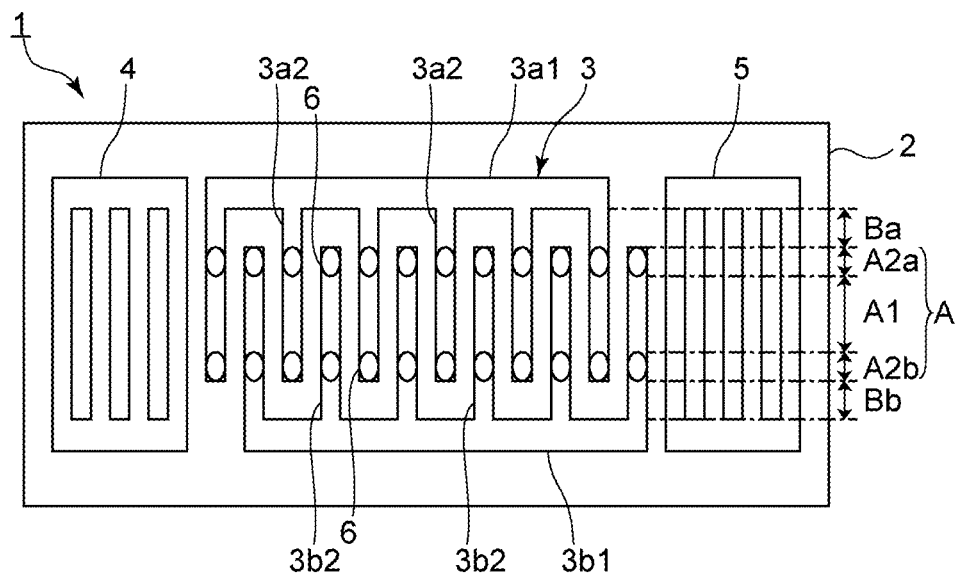
FIG. 1 is a plan view of an acoustic wave device according to a first preferred embodiment of the present invention.
Figure 2:
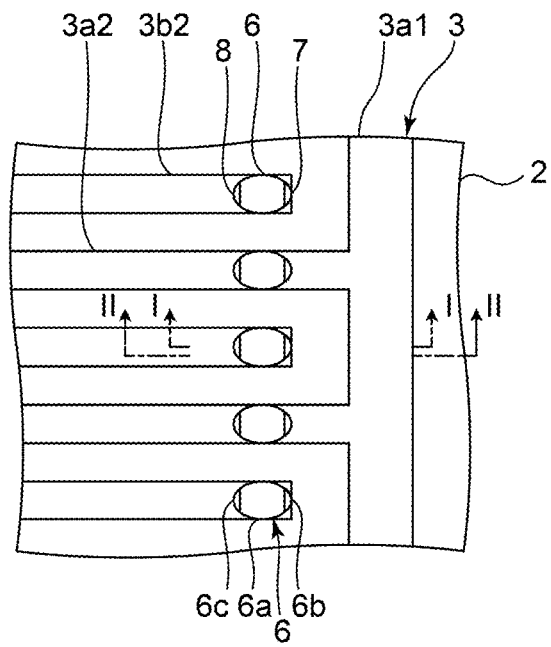
FIG. 2 is an enlarged view of a portion near the tips of second electrode fingers of an IDT electrode according to the first preferred embodiment of the present invention.
Figure 3:
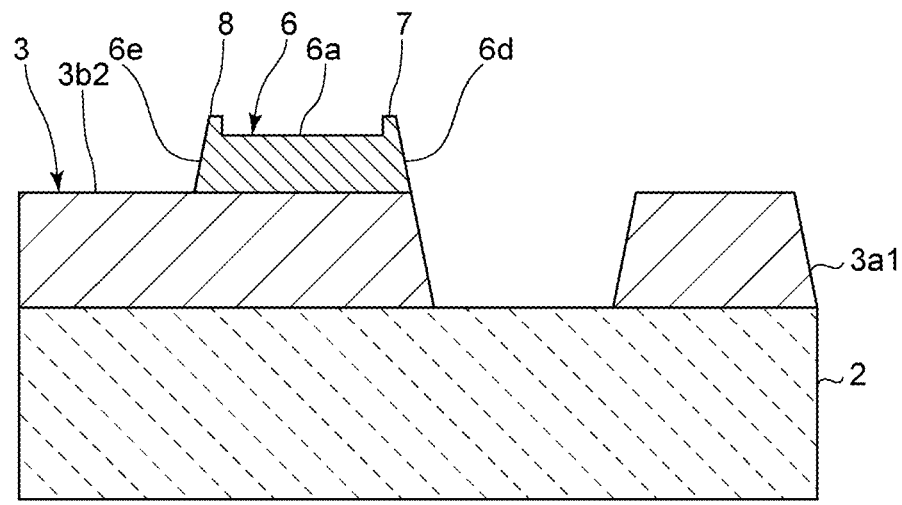
FIG. 3 is a cross-sectional view taken along line I-I of FIG. 2.

FIG. 1 is a plan view of an acoustic wave device according to a first preferred embodiment of the present invention. FIG. 2 is an enlarged view of a portion near the tips of second electrode fingers of an IDT electrode according to the first preferred embodiment. FIG. 3 is a cross-sectional view taken along line I-I of FIG. 2. Note that the second electrode fingers of the IDT electrode will be described later.

An acoustic wave device 1 includes a piezoelectric substrate 2. The piezoelectric substrate 2 includes a piezoelectric single crystal such as $LiNbO_3$ or $LiTaO_3$, or appropriate piezoelectric ceramics.

An IDT electrode 3 is provided on the piezoelectric substrate 2. Acoustic waves are excited in response to application of an alternating-current (AC) voltage to the IDT electrode 3. A reflector 4 and a reflector 5 are arranged on both sides in an acoustic wave propagating direction of the IDT electrode 3.

The IDT electrode 3 includes a first busbar 3a1 and a second busbar 3b1 facing each other. The IDT electrode 3 includes a plurality of first electrode fingers 3a2 including first ends are connected to the first busbar 3a1. The IDT electrode 3 further includes a plurality of second electrode fingers 3b2 including first ends are connected to the second busbar 3b1.

The plurality of first electrode fingers 3a2 and the plurality of second electrode fingers 3b2 interdigitate with each other. The IDT electrode 3 includes a crossing area A, which is a portion where the first electrode fingers 3a2 and the second electrode fingers 3b2 overlap each other in the acoustic wave propagating direction. Here, it is assumed that a direction in which the first electrode fingers 3a2 and the second electrode fingers 3b2 extend is a direction orthogonal to the acoustic wave propagating direction of the first electrode fingers 3a2 and the second electrode fingers 3b2. At this time, the crossing area A includes a central area A1, which is positioned on the center side in a direction orthogonal to the acoustic wave propagating direction, and a first edge area A2a and a second edge area A2b, which are arranged on both sides of the central area A1 in a direction orthogonal to the acoustic wave propagating direction. The first edge area A2a is positioned on the first busbar 3a1 side, and the second edge area A2b is positioned on the second busbar 3b1 side.

The IDT electrode 3 includes a first outer area Ba and a second outer area Bb, which are areas on a side opposite to the central area A1 side of the first edge area A2a and the second edge area A2b. The first outer area Ba is positioned between the first edge area A2a and the first busbar 3a1. The second outer area Bb is positioned between the second edge area A2b and the second busbar 3b1.

In the present preferred embodiment, the IDT electrode 3 includes a laminated metal film obtained by laminating a plurality of metal layers. More specifically, a NiCr layer, a Pt layer, a Ti layer, an Al layer, and a Ti layer are laminated in this order from the piezoelectric substrate 2 side in the IDT electrode 3. With regard to the film thickness of each metal layer, the film thickness of the NiCr layer is about 10 nm; the film thickness of the Pt layer is about 200 nm; the film thickness of the Ti layer is about 10 nm; the film thickness of the Al layer is about 300 nm; and the film thickness of the Ti layer is about 10 nm, for example. Note that the metals used in the IDT electrode 3 and the film thickness of each metal layer are not restricted to the above. The IDT electrode 3 may include a single-layer metal film.

Mass adding films 6 are provided in respective portions of the first electrode fingers 3a2 and the second electrode fingers 3b2 of the IDT electrode 3, the respective portions being positioned in the first edge area A2a and the second edge area A2b.

Here, it is assumed that a direction in which each of the first electrode fingers 3a2 extends is each first length direction, and a direction in which each of the second electrode fingers 3b2 extends is each second length direction. At this time, as illustrated in FIG. 2, each mass adding film 6 includes a central portion 6a, which is positioned at the center in each first length direction or each second length direction. Each mass adding film 6 includes a first end portion 6b and a second end portion 6c, which are positioned at both ends in each first length direction or each second length direction. Note that, in the present preferred embodiment, each first length direction, each second length direction, and a direction orthogonal to the acoustic wave propagating direction are the same direction.

Here, it is assumed that a dimension along the acoustic wave propagating direction of the mass adding films 6 is the width. At this time, in the present preferred embodiment, the width of the first end portion 6b and the width of the second end portion 6c are narrower than the width of the central portion 6a in the mass adding films 6. The planar shape of the mass adding films 6 is oval or substantially oval. Note that the planar shape of the mass adding films 6 is not restricted to the above.

It is desirable that the planar shape of the mass adding films 6 be ideally a shape that conforms to the shape of a portion of the first electrode fingers 3a2 and the second electrode fingers 3b2 in the first edge area A2a and the second edge area A2b. For example, in the case illustrated in FIG. 2, it is desirable that the planar shape of the mass adding films 6 be rectangular. However, as in the present preferred embodiment, the planar shape of the mass adding films 6 actually tends to be curved in the corner portions.

As illustrated in FIG. 3, the mass adding films 6 each include a first end surface 6d, which is an end surface positioned in the first end portion, and a second end surface 6e, which is an end surface positioned in the second end portion. The first end surface 6d and the second end surface 6e extend inclined with respect to the thickness direction of the mass adding film 6. Note that an end surface positioned at the tips of the first electrode fingers 3a2 and the second electrode fingers 3b2 of the IDT electrode 3 also are inclined with respect to the thickness direction of the IDT electrode 3.

It is desirable that the first end surface 6d and the second end surface 6e of the mass adding films 6 ideally extend parallel to the thickness direction of the mass adding films 6. However, as in the present preferred embodiment, the first end surface 6d and the second end surface 6e of the mass adding films 6 actually tend to extend inclined, as described above.

As illustrated in FIG. 2, the mass adding films 6 each include a protruding portion 7, which protrudes from the first end portion 6b to a side opposite to the piezoelectric substrate 2 side. Similarly, the mass adding films 6 each include a protruding portion 8, which protrudes from the second end portion 6c to a side opposite to the piezoelectric substrate 2 side. Note that it is only necessary that a protruding portion be provided in at least one of the first end portion 6b and the second end portion 6c.

In the present preferred embodiment, the mass adding films 6 include a laminated metal film obtained by laminating a plurality of metal layers. More specifically, a Ti layer, a Pt layer, and a Ti layer are laminated in this order from the IDT electrode 3 side. With regard to the film thickness of each metal layer, the film thickness of the Ti layer is about 10 nm; the film thickness of the Pt layer is about 60 nm; and the film thickness of the Ti layer is about 10 nm, for example. The protruding portion 7 and the protruding portion 8 include a Ti layer including film thickness is about 40 nm, for example, which is provided on the above-described Pt layer. Note that the metals used in the mass adding films 6 and the protruding portions 7 and 8 and the film thickness of each metal layer are not restricted to the above. The mass adding films 6 may include a single-layer metal film.

Here, it is assumed that an angle of inclination with respect to the thickness direction of the mass adding films 6 is an inclination angle. At this time, in the present preferred embodiment, the inclination angle of the first end surface 6d and the inclination angle of the protruding portion 7 are the same. Similarly, the inclination angle of the second end surface 6e and the inclination angle of the protruding portion 8 are the same. Note that the first end surface 6d and the protruding portion 7 may have different inclination angles. Similarly, the second end surface 6e and the protruding portion 8 may have different inclination angles.

Referring back to FIG. 1, because the mass adding films 6 are provided, the acoustic velocity of acoustic waves in the first edge area A2a and the second edge area A2b is slower than the acoustic velocity of acoustic waves in the central area A1. Here, it is assumed that the acoustic velocity of acoustic waves in the central area A1 is V1, and the acoustic velocity of acoustic waves in the first edge area A2a and the second edge area A2b is V2. At this time, V1>V2. As described above, the first edge area A2a and the second edge area A2b are a first low-acoustic-velocity area and a second low-acoustic-velocity area, respectively, where the acoustic velocity is slower than the central area A1.

A portion positioned in the first outer area Ba includes only the first electrode fingers 3a2. A portion positioned in the second outer area Bb includes only the second electrode fingers 3b2. Accordingly, the acoustic velocity of acoustic waves in the first outer area Ba and the second outer area b2 is faster than the acoustic velocity of acoustic waves in the central area A1. Here, it is assumed that the acoustic velocity in the first outer area Ba and the second outer area Bb is V3. At this time, V3>V1. As described above, the first outer area Ba and the second outer area Bb are a first high-acoustic-velocity area and a second high-acoustic-velocity area, respectively, where the acoustic velocity is faster than the central area A1.

Because the first and second low-acoustic-velocity areas are arranged outside the central area A1, and the first and second high-acoustic-velocity areas are arranged outside the first and second low-acoustic-velocity areas, unnecessary waves are reduced or prevented. As described above, the acoustic wave device 1 is an acoustic wave device using a piston mode.

It is preferable that the acoustic velocity on the low-acoustic-velocity area side at the boundary between the low-acoustic-velocity area and the high-acoustic-velocity area be V2, and the acoustic velocity on the high-acoustic-velocity area side be V3. However, as described above, actually, the mass adding films 6 tend to be curved in the corner portions of the planar shape, and the first and second end surfaces tend to extend inclined with respect to the thickness direction. For these reasons, the acoustic velocity tends to be sloped between the low-acoustic-velocity area and the high-acoustic-velocity area.

Here, one of the unique features of the present preferred embodiment is that, as illustrated in FIG. 2, the mass adding films 6 each include the protruding portion 7 and the protruding portion 8 protruding from the first end portion 6b and the second end portion 6c, respectively, to a side opposite to the piezoelectric substrate 2. In doing so, the slope of acoustic velocity at the boundary between two areas with different acoustic velocities is able to be made steeper, thus effectively reducing or preventing unnecessary waves. This point will be described below by comparing the present preferred embodiment and a comparative example.

Note that the comparative example is different from the present preferred embodiment in the point that mass adding films have no protruding portion.

Figure 4:
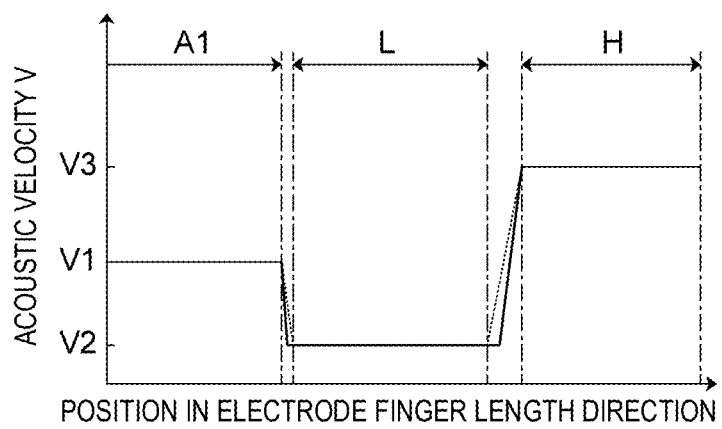
FIG. 4 is a diagram for describing the relationship between the position in a second length direction of a portion corresponding to a portion along line I-I of FIG. 2, and the acoustic velocity of the acoustic wave device of the first preferred embodiment of the present invention and a comparative example.

FIG. 4 is a diagram for describing the relationship between the position in the second length direction of a portion corresponding to a portion along line I-I of FIG. 2, and the acoustic velocity of the acoustic wave device of the first preferred embodiment and the comparative example. In FIG. 4, a solid line represents the result of the first preferred embodiment, and a broken line represents the result of the comparative example.

Note that it is assumed that, in FIG. 4, an end portion on the first low-acoustic-velocity area L side of the first high-acoustic-velocity area H is a position where the end surface on the tip side of the second electrode finger is in contact with the piezoelectric substrate. It is assumed that an end portion on the first high-acoustic-velocity area H side of the first low-acoustic-velocity area L is a position corresponding to the film thickness of the central portion of the mass adding film on the first end surface of the mass adding film. It is assumed that an end portion on the central area A1 side of the first low-acoustic-velocity area L is a position corresponding to the film thickness of the central portion of the mass adding film on the second end surface of the mass adding film. It is assumed that an end portion on the first low-acoustic-velocity area L side of the central area A1 is a position where the second end surface of the mass adding film and the second electrode finger contact each other.

As illustrated in FIG. 4, it is clear that the slope of acoustic velocity at the boundary between the first low-acoustic-velocity area L and the first high-acoustic-velocity area H is steeper in the first preferred embodiment than in the comparative example. In the first preferred embodiment, the mass adding films each include a protruding portion that protrudes from the first end portion. For that reason, the film thickness of the mass adding film is thicker in the first end portion. Therefore, the acoustic velocity is able to be even slower in the protruding portion. It is therefore considered that the average acoustic velocity around the protruding portion, which includes an area between the first low-acoustic-velocity area L and the first high-acoustic-velocity area H, becomes slower, and the slope of acoustic velocity at the boundary between the first low-acoustic-velocity area L and the first high-acoustic-velocity area H is able to be made steeper.

As illustrated in FIG. 4, it is clear that the slope of acoustic velocity at the boundary between the first low-acoustic-velocity area L and the central area A1 is steeper in the first preferred embodiment than in the comparative example. In the first preferred embodiment, the mass adding films each include a protruding portion that protrudes from the second end portion. It is therefore considered that the average acoustic velocity around the protruding portion, which includes an area between the first low-acoustic-velocity area L and the central area A1, becomes slower, and the slope of acoustic velocity at the boundary between the first low-acoustic-velocity area L and the central area A1 is able to be made steeper.

Figure 5:
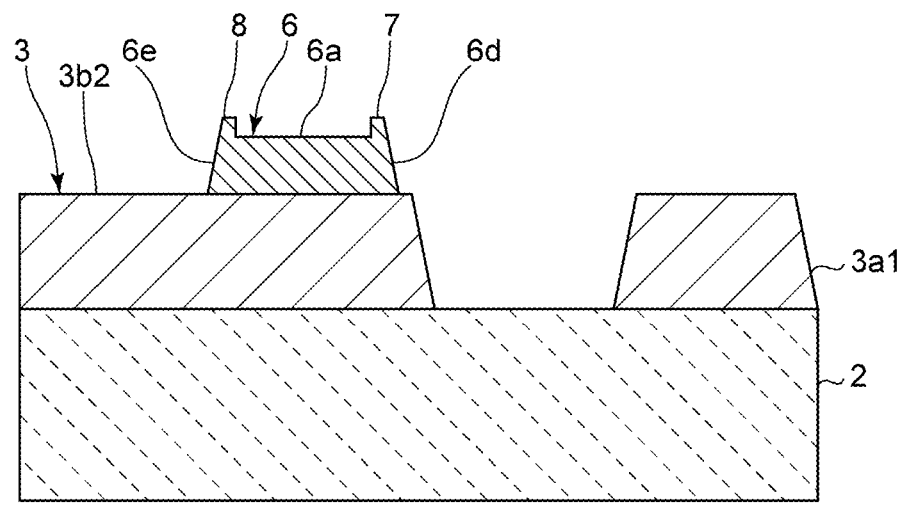
FIG. 5 is a cross-sectional view taken along line II-II of FIG. 2 of the acoustic wave device according to the first preferred embodiment of the present invention.

FIG. 5 is a cross-sectional view taken along line II-II of FIG. 2 of the acoustic wave device according to the first preferred embodiment.

A portion along line I-I of FIG. 2 crosses the center in the acoustic wave propagating direction of the mass adding film 6. In contrast, a portion along line II-II is shifted in the acoustic wave propagating direction from the center in the acoustic wave propagating direction of the mass adding film 6. As illustrated in FIG. 5, the mass adding film 6 does not reach the tip of the second electrode finger 3b2 in the portion along line II-II. As illustrated in FIG. 2, because the planar shape of the mass adding films 6 is oval or substantially oval, the mass adding films 6 reach the tips of the second electrode fingers 3b2 in the portion along line I-I, but does not reach the tips in the portion along line II-II. In this manner, the mass is lost in the acoustic wave propagating direction. The same applies to the comparative example.

In the comparative example, because the mass is lost as described above, as illustrated in FIG. 4, the slope of acoustic velocity is made more moderate at the boundary between the first low-acoustic-velocity area L and the first high-acoustic-velocity area H.

In contrast, in the first preferred embodiment, the mass adding films each include the protruding portions. Therefore, a mass equivalent to the partially lost mass in the acoustic wave propagating direction can be added in the thickness direction. In doing so, the slope of acoustic velocity at the boundary between the first low-acoustic-velocity area L and the first high-acoustic-velocity area H and between the first low-acoustic-velocity area L and the central area A1 is able to be made steeper. Therefore, in the first preferred embodiment, even in the case where the planar shape of the mass adding films is oval or substantially oval and the width of the first and second end portions is narrower than the width of the central portion, unnecessary waves are able to be effectively reduced or prevented.

FIG. 4 illustrates, as areas with different acoustic velocities, the central area A1, the first low-acoustic-velocity area L, and the first high-acoustic-velocity area H on the first busbar side. In the first preferred embodiment, like the above case, the slope of acoustic velocity is able to be made steeper between the second low-acoustic-velocity area and the second high-acoustic-velocity area and between the second low-acoustic-velocity area and the central area A1 on the second busbar side, and unnecessary waves are able to be effectively reduced or prevented.

In this manner, although the first end surface and the second end surface of the mass adding films actually tend to incline with respect to the thickness direction of the mass adding films, unnecessary waves are able to be effectively reduced or prevented in the present preferred embodiment.

It is preferable that the protruding portion 7 illustrated in FIG. 2 be provided in the full width of the first end portion 6b. In doing so, the slope of acoustic velocity at the boundary between the first low-acoustic-velocity area and the first high-acoustic-velocity area is able to be effectively made steeper. Likewise, it is preferable that the protruding portion 8 be provided in the full width of the second end portion 6c. In doing so, the slope of acoustic velocity at the boundary between the first low-acoustic-velocity area and the central area is able to be effectively made steeper.

Note that, as described above, it is only necessary that a protruding portion be provided in at least one of the first end portion 6b and the second end portion 6c. In the case where the protruding portion 7 is provided in the first end portion 6b, because the slope of acoustic velocity at the boundary between the first low-acoustic-velocity area and the first high-acoustic-velocity area is able to be made steeper, unnecessary waves are reduced or prevented. In the case where the protruding portion 8 is provided in the second end portion 6c, because the slope of acoustic velocity at the boundary between the first low-acoustic-velocity area and the central area is able to be made steeper, unnecessary waves are reduced or prevented.

It is only necessary that at least one of the protruding portion 7 and the protruding portion 8 be provided in at least one mass adding film 6. It is preferable that at least one of the protruding portion 7 and the protruding portion 8 be provided in all of the mass adding films 6. In doing so, because the slope of acoustic velocity at the boundary between two areas with different acoustic velocities is able to be made even steeper, unnecessary waves are able to be even more reduced or prevented.

It is more preferable that the protruding portion 7 and the protruding portion 8 be provided in all of the mass adding films 6. In doing so, because the slope of acoustic velocity at both boundaries between the low-acoustic-velocity area and the central area and between the low-acoustic-velocity area and the high-acoustic-velocity area is able to be made even steeper, unnecessary waves are able to be even more reduced or prevented.

The above description states that it is actually difficult to make the planar shape of the mass adding films 6 rectangular or the like. In the acoustic wave device 1, the planar shape of the mass adding films 6 may be a shape that conforms to the shape of a portion of the first electrode fingers 3a2 and the second electrode fingers 3b2 in the first edge area and the second edge area. For example, the planar shape of the mass adding films 6 may be rectangular or the like. Even in this case, because the mass adding films 6 include at least one of the protruding portion 7 and the protruding portion 8, the slope of acoustic velocity at the boundary between areas with different acoustic velocities is able to be made even steeper, and unnecessary waves are able to be even more effectively reduced or prevented.

Figure 12:
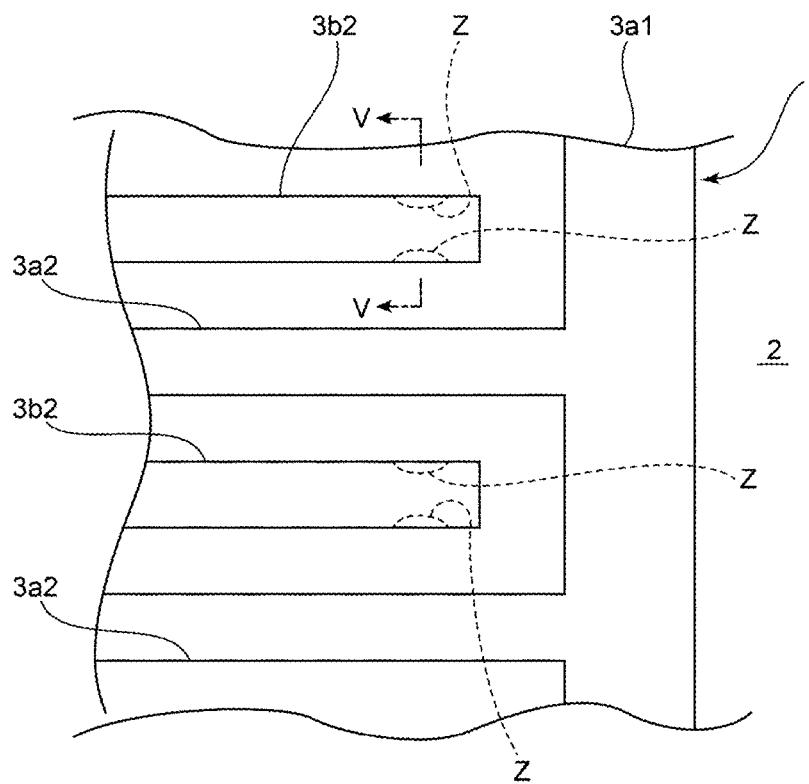
FIG. 12 is an enlarged plan view of a portion near the tips of the second electrode fingers of the IDT electrode according to a modification of the first preferred embodiment of the present invention.
Figure 13:
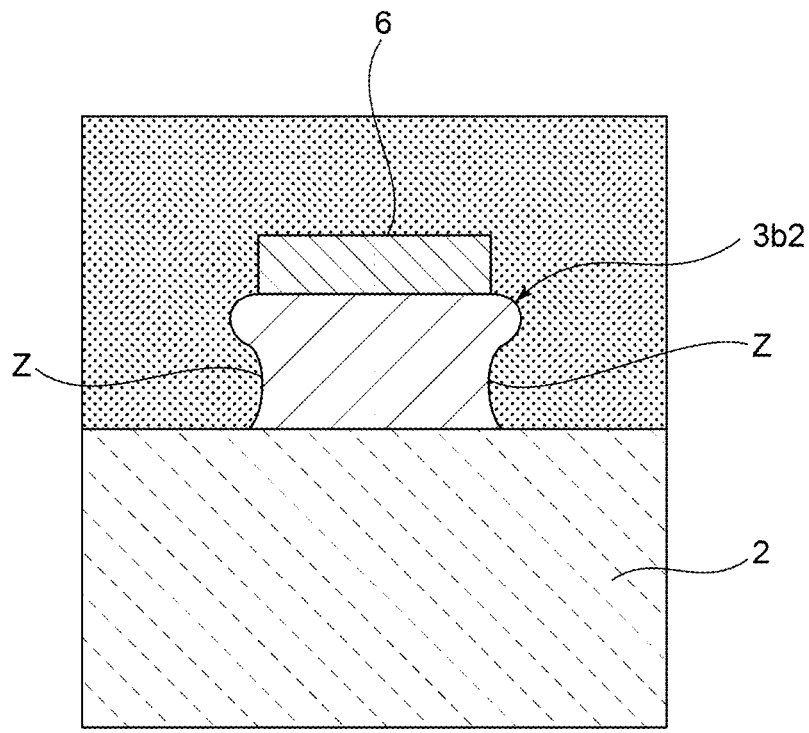
FIG. 13 is a cross-sectional view corresponding to a portion along line V-V of FIG. 12.

FIG. 12 is an enlarged plan view of a portion near the tips of the second electrode fingers of an acoustic wave device according to a modification of the first preferred embodiment. FIG. 13 is a cross-sectional view taken along line V-V of FIG. 12. As illustrated in FIGS. 12 and 13, there may be a concave portion Z on the side walls of the first electrode fingers 3a2 and the second electrode fingers 3b2 positioned below the mass adding films 6 in the first and second low-acoustic-velocity areas where the mass adding films 6 are laminated. Here, the side walls refer to a pair of side walls that are extended in a direction in which the first and second electrode fingers 3a2 and 3b2 extend, and that face each other in the acoustic wave propagating direction. There may be the concave portion Z on some of the side walls in the first and second low-acoustic-velocity areas. In this case, there may be the concave portion Z on one of the paired side walls or on both of the paired side walls facing each other.

Figure 6:
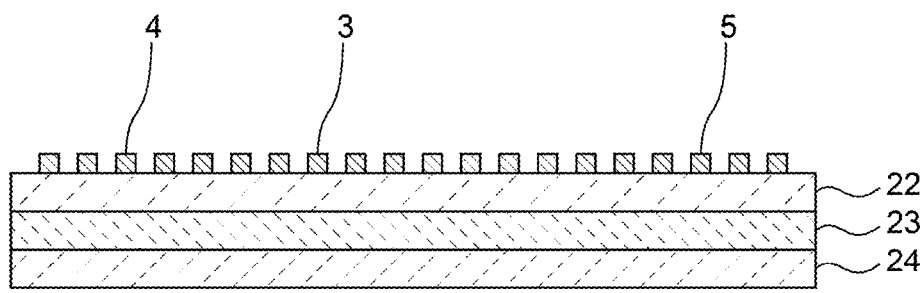
FIG. 6 is a front cross-sectional view of an acoustic wave device according to a modification of the first preferred embodiment of the present invention.

By the way, although a piezoelectric substance is the piezoelectric substrate 2 in the first preferred embodiment, a piezoelectric substance may be a piezoelectric thin film 22, as in a modification of the first preferred embodiment, illustrated in FIG. 6. For example, a low-acoustic-velocity film 23 is provided on a surface of the piezoelectric thin film 22 opposite to a surface on which the IDT electrode 3 is provided. A high-acoustic-velocity member 24 may be provided on a surface of the low-acoustic-velocity film 23 opposite to the piezoelectric thin film 22 side.

Here, the low-acoustic-velocity film 23 is a film in which the acoustic velocity of bulk waves propagating therethrough is slower than the acoustic velocity of acoustic waves propagating through the piezoelectric thin film 22. The low-acoustic-velocity film 23 is made of a material including main component is a compound obtained by adding fluorine, carbon, or boron to glass, silicon oxynitride, tantalum oxide, or silicon oxide. Note that it is only necessary that the material of the low-acoustic-velocity film 23 be a relatively low-acoustic-velocity material.

The high-acoustic-velocity member 24 is a member in which the acoustic velocity of bulk waves propagating therethrough is faster than the acoustic velocity of acoustic waves propagating through the piezoelectric thin film 22. The high-acoustic-velocity member 24 is made of a material including main component is aluminum nitride, aluminum oxide, silicon carbide, silicon oxynitride, DLC film, or diamond. Note that it is only necessary that the material of the high-acoustic-velocity member 24 be a relatively high-acoustic-velocity material.

The high-acoustic-velocity member 24 may be a high-acoustic-velocity film or a high-acoustic-velocity substrate. In the case where there are provided the low-acoustic-velocity film 23 and the high-acoustic-velocity member 24 as described above, the energy of acoustic waves can be effectively confined.

The acoustic wave device 1 of the first preferred embodiment may be manufactured using, for example, lift-off technology. Hereinafter, an example method of manufacturing the acoustic wave device 1 of the first preferred embodiment will be described.

Figure 7A:
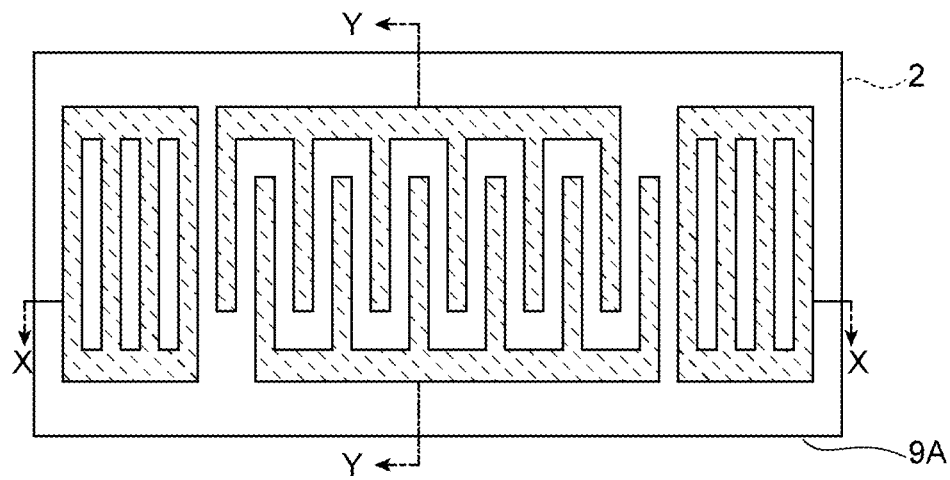
FIGS. 7A to 7C are plan views for describing an example method of manufacturing the acoustic wave device according to the first preferred embodiment of the present invention.
Figure 7B:
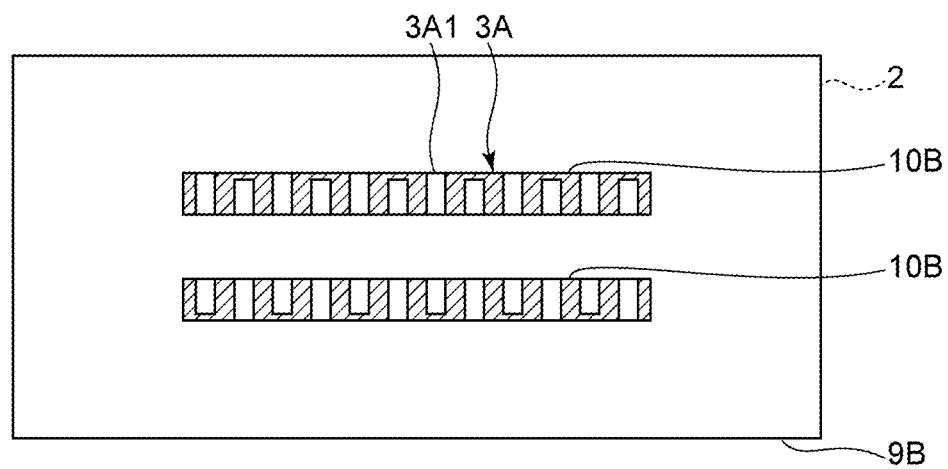
Figure 7C:
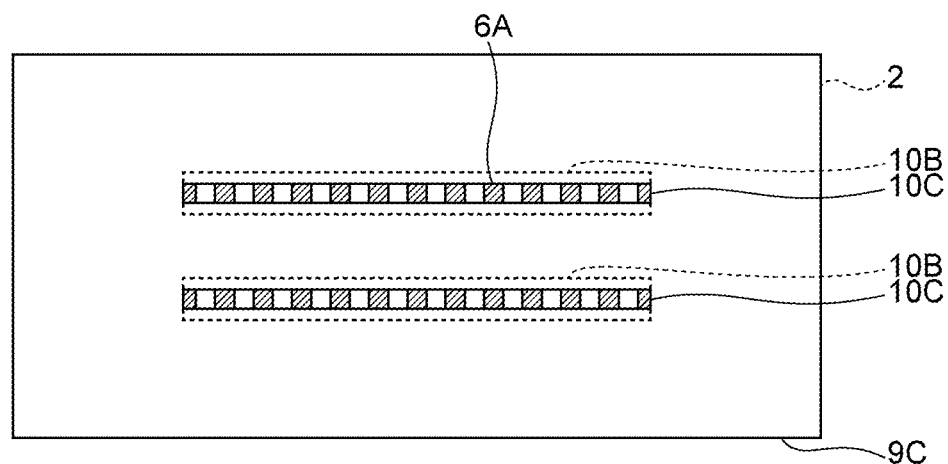

FIGS. 7A to 7C are plan views for describing the example method of manufacturing the acoustic wave device according to the first preferred embodiment. FIGS. 8A to 8E are cross-sectional views corresponding to a portion along line X-X of FIG. 7A for describing the example method of manufacturing the acoustic wave device according to the first preferred embodiment. FIGS. 9A to 9D are cross-sectional views corresponding to a portion along line Y-Y of FIG. 7A for describing the example method of manufacturing the acoustic wave device according to the first preferred embodiment. FIGS. 10A to 10C are cross-sectional views corresponding to a portion along line Y-Y of FIG. 7A for describing the example method of manufacturing the acoustic wave device according to the first preferred embodiment.

Note that FIG. 7A illustrates a portion of the piezoelectric substrate that is exposed from a later-described first resist pattern by dashed diagonal-line hatching. FIG. 7B illustrates a metal film for the IDT electrode, laminated on the first resist pattern, by diagonal-line hatching. FIG. 7C illustrates a metal film for the mass adding films, laminated above the first resist pattern, by diagonal-line hatching.

Figure 8A:
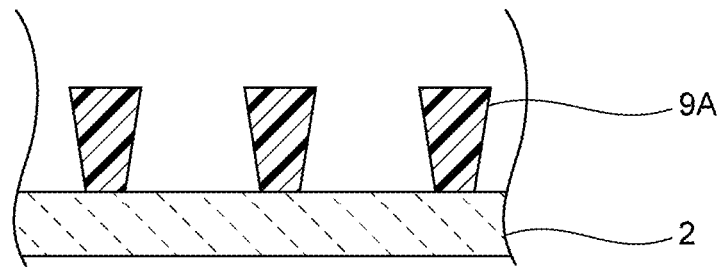
FIGS. 8A to 8E are cross-sectional views corresponding to a portion along line X-X of FIG. 7A for describing the example method of manufacturing the acoustic wave device according to the first preferred embodiment of the present invention.
Figure 9A:
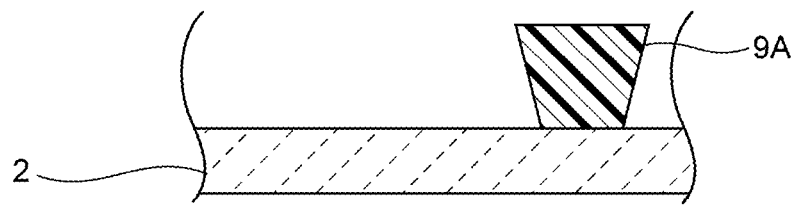
FIGS. 9A to 9D are cross-sectional views corresponding to a portion along line Y-Y of FIG. 7A for describing the example method of manufacturing the acoustic wave device according to the first preferred embodiment of the present invention.
Figure 10A:
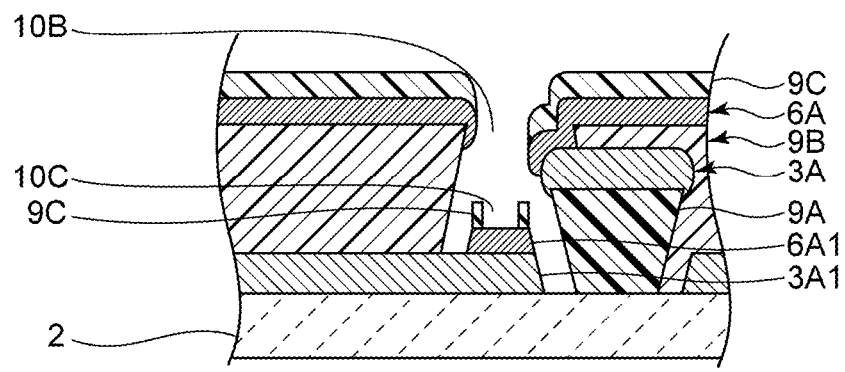
FIGS. 10A to 10C are cross-sectional views corresponding to a portion along line Y-Y of FIG. 7A for describing the example method of manufacturing the acoustic wave device according to the first preferred embodiment of the present invention.
Figure 10B:
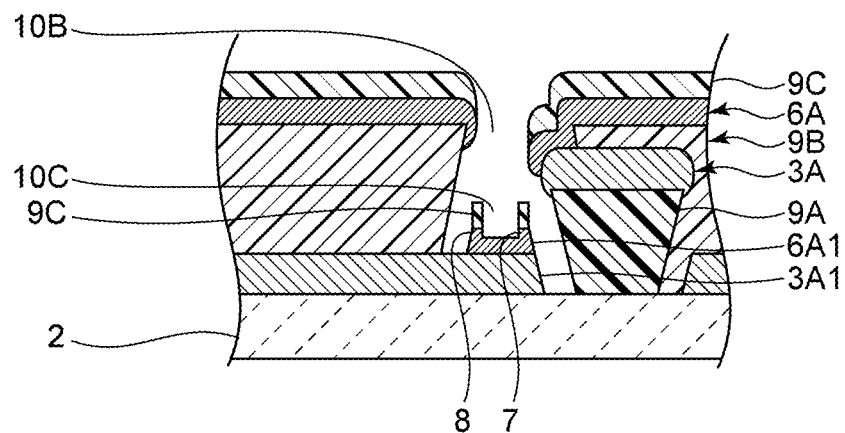
Figure 10C:
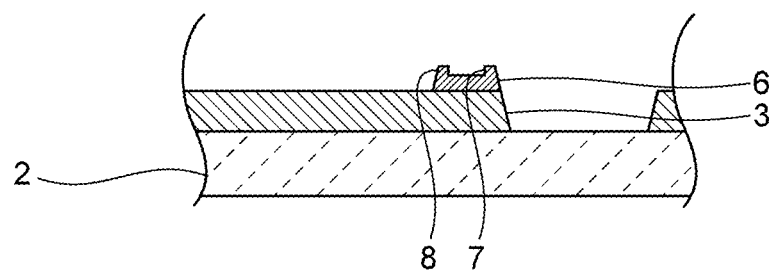

As illustrated in FIGS. 7A, 8A, and 9A, the piezoelectric substrate 2 is prepared. Next, a first resist pattern 9A is formed by photolithography on the piezoelectric substrate 2. Here, a resist pattern is a patterned resist layer.

The first resist pattern 9A includes a cavity where an IDT electrode and reflectors will be formed by a later-described step. FIG. 8A illustrates a portion of the cavity where the first and second electrode fingers of the IDT electrode will be formed. In the present preferred embodiment, a negative resist or an image reversal resist is used as the first resist pattern 9A. Note that a positive resist or the like may be used as the first resist pattern 9A.

Figure 8B:
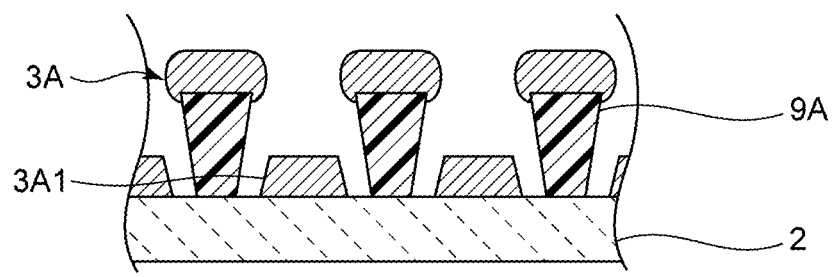
Figure 9B:
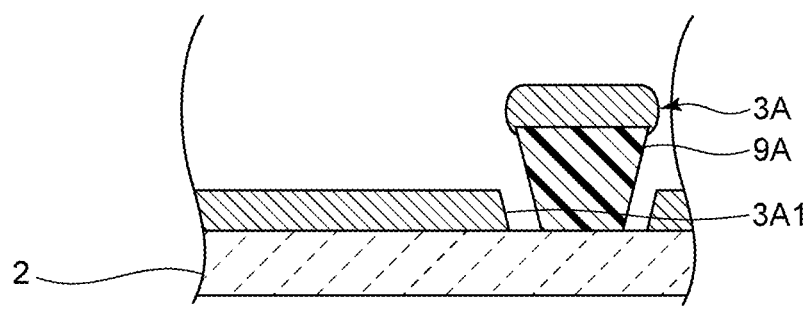

Next, as illustrated in FIGS. 8B and 9B, a metal film 3A for the IDT electrode and reflectors is laminated on the piezoelectric substrate 2 and the first resist pattern 9A. In the present preferred embodiment, the metal film 3A is a multilayer metal film formed by laminating a plurality of metal layers. More specifically, a NiCr layer, a Pt layer, a Ti layer, an Al layer, and a Ti layer are laminated in this order from the piezoelectric substrate 2 side. The above-mentioned metal layers can be laminated by, for example, vacuum vapor deposition. At this time, the metal film 3A includes an IDT electrode portion 3A1, which is a portion corresponding to the IDT electrode positioned on the piezoelectric substrate 2. The IDT electrode portion 3A1 is formed along the first resist pattern 9A.

Figure 9C:
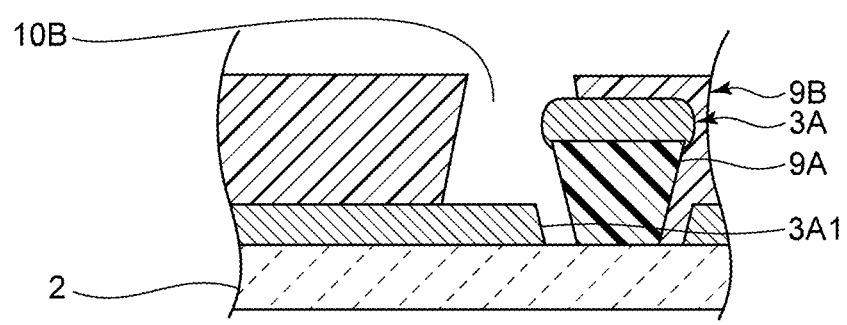

Next, as illustrated in FIGS. 7B and 9C, a second resist pattern 9B including a plurality of cavities 10B is formed on the metal film 3A by photolithography. More specifically, in the present preferred embodiment, the second resist pattern 9B includes one cavity 10B for each of portions corresponding to the first and second low-acoustic-velocity areas arranged in the first and second edge areas A2a and A2b illustrated in FIG. 1. Note that the number and position of the cavities 10B are not restricted to the above, and the number and position of the cavities 10B may be determined according to the position for providing the mass adding films.

FIG. 7B illustrates a portion of the metal film 3A, which is laminated on the first resist pattern, by diagonal-line hatching in an exaggerated manner. As illustrated by diagonal-line hatching in FIG. 7B, the second resist pattern 9B is provided such that the metal film 3A laminated on the first resist pattern will be positioned inside each cavity 10B when viewed in plan.

The second resist pattern 9B is laminated on the metal film 3A for the IDT electrode. Note that the second resist pattern 9B may include a portion directly laminated on the piezoelectric substrate 2.

Figure 8C:
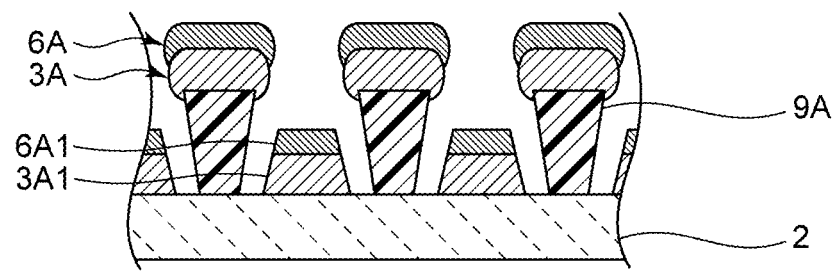
Figure 9D:
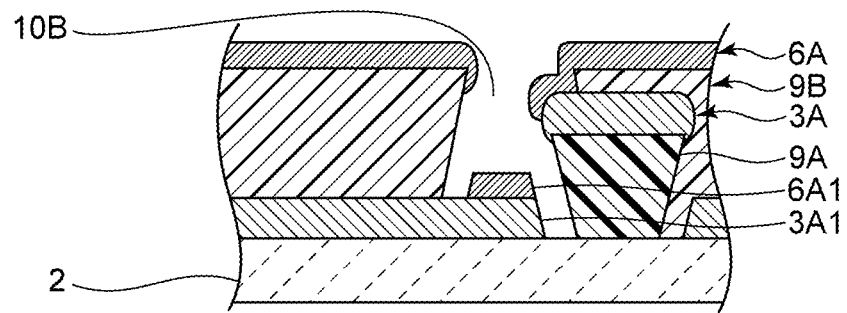

Next, as illustrated in FIGS. 8C and 9D, a metal film 6A to provide mass adding films is laminated on the metal film 3A and the second resist pattern 9B. In the present preferred embodiment, the metal film 6A is a multilayer metal film obtained by laminating a plurality of metal layers. A Ti layer, a Pt layer, and a Ti layer are laminated in this order. The above-mentioned metal layers can be laminated by, for example, vacuum vapor deposition.

At this time, the metal film 6A includes a mass adding film portion 6A1, which is a portion corresponding to a mass adding film laminated on the IDT electrode portion 3A1. The mass adding film portion 6A1 includes a first end portion on the first and second high-acoustic-velocity area side, and a second end portion on the central area side, as in the mass adding films.

As described above, the IDT electrode portion 3A1 is formed along the first resist pattern 9A. The first end portion of the mass adding film portion 6A1 is formed along the first resist pattern 9A. In doing so, the mass adding films can be formed with high accuracy so as to reach the tips of the first electrode fingers and the second electrode fingers of the IDT electrode. Accordingly, unnecessary waves are able to be effectively reduced or prevented in the acoustic wave device 1.

Next, as illustrated in FIGS. 7C and 10A, a third resist pattern 9C including a plurality of cavities 10C is formed by photolithography on the metal film 6A for the mass adding films. The third resist pattern 9C is formed such that the cavities 10C will be positioned inside the cavities 10B of the second resist pattern when viewed in plan. More specifically, the cavities 10C are provided such that portions of the third resist pattern 9C, positioned on the mass adding film portion 6A1, will only be the first end portion and the second end portion.

Figure 8D:
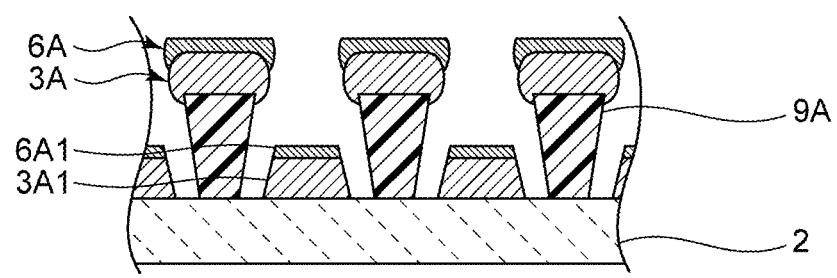

Next, as illustrated in FIGS. 8D and 10B, the film thickness of a portion other than the first end portion and the second end portion of the metal film 6A is made thinner by dry etching. Accordingly, the protruding portion 7 and the protruding portion 8, illustrated in FIG. 10B, are formed. At this time, because the piezoelectric substrate 2 is covered by the first to third resist patterns 9A to 9C, the frequency characteristics do not easily deteriorate even when dry etching is performed.

Figure 8E:
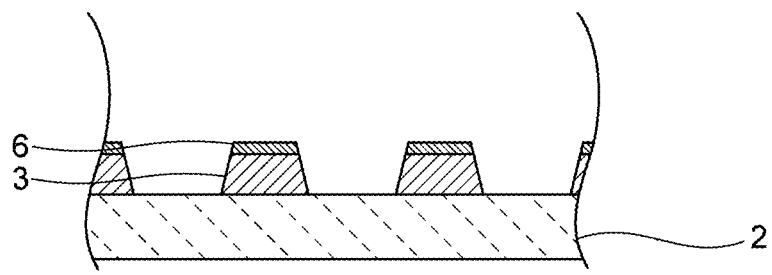

Next, the first to third resist patterns 9A to 9C are peeled from the piezoelectric substrate 2, as illustrated in FIGS. 8E and 10C. Note that, although the planar shape of the mass adding films 6 is ideally rectangular, the planar shape actually tends to be curved in the corner portions in the case of the present preferred embodiment.

In the above-described example manufacturing method, the protruding portion 7 and the protruding portion 8 of the mass adding films 6 are formed by dry etching. Note that the method of forming the protruding portion 7 and the protruding portion 8 is not restricted to the above. For example, in the step illustrated in FIG. 8B, each cavity of the second resist pattern is formed to be flush with the tips of the first electrode fingers and the second electrode fingers of the above-mentioned IDT electrode when viewed in plan. Note that the first resist pattern may be peeled before forming the second resist pattern. Next, a metal film for the mass adding films is formed. At this time, the above-mentioned metal film is formed such that the first end portion and the second end portion of the mass adding film portion will be in contact with the second resist pattern. Next, the first and second resist patterns are peeled. Accordingly, protruding portions are formed. The productivity is able to be improved since the step of forming the third resist pattern is unnecessary in this case.

Figure 11:
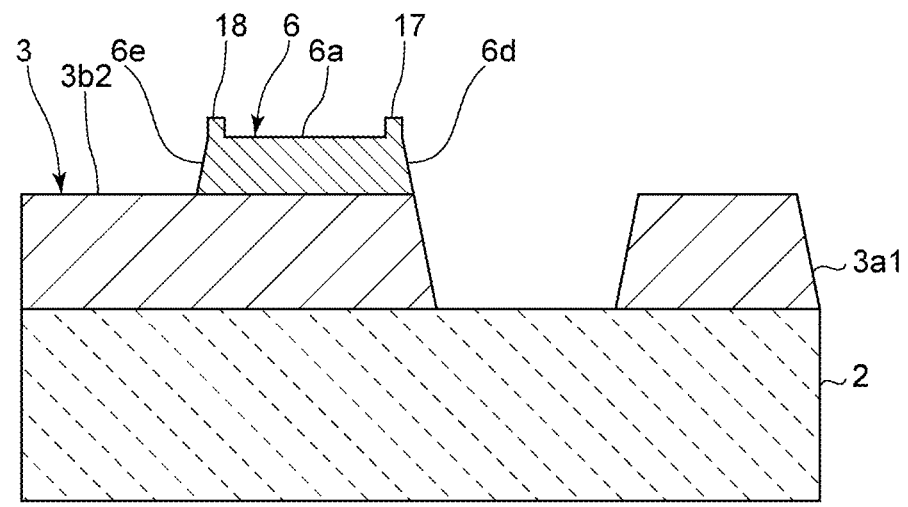
FIG. 11 is a cross-sectional view corresponding to a portion along line I-I of FIG. 2 near a mass adding film according to a second preferred embodiment of the present invention.

FIG. 11 is a cross-sectional view corresponding to a portion along line I-I of FIG. 2 near the mass adding film according to a second preferred embodiment of the present invention.

An acoustic wave device of the present preferred embodiment is different from the first preferred embodiment in the point that the inclination angle of a protruding portion 17 is less than the inclination angle of the first end surface 6d, and the inclination angle of a protruding portion 18 is less than the inclination angle of the second end surface 6e. The acoustic wave device of the present preferred embodiment has the same configuration as that of the acoustic wave device 1 of the present preferred embodiment except for the above-mentioned point.

Because the inclination angle of the protruding portion 17 is small in the present preferred embodiment, the film thickness of the mass adding films 6 is able to be made even thicker on the first high-acoustic-velocity area side of the first low-acoustic-velocity area. Therefore, the slope of acoustic velocity at the boundary between the first low-acoustic-velocity area and the first high-acoustic-velocity area is able to be made even steeper. Because the inclination angle of the protruding portion 18 is also small in the present preferred embodiment, the film thickness of the mass adding films 6 is able to be made even thicker on the central area side of the first low-acoustic-velocity area. Therefore, the slope of acoustic velocity at the boundary between the first low-acoustic-velocity area and the central area is able to be made even steeper. Therefore, unnecessary waves are able to be even more reduced or prevented.

Note that the slope of acoustic velocity at the boundary between areas with different acoustic velocities is able to be made even steeper similarly on the second busbar side, and unnecessary waves are able to be even more reduced or prevented.

The above-described acoustic wave device can be used as a duplexer or the like in an RF front-end circuit. This example will be described below.

Figure 14:
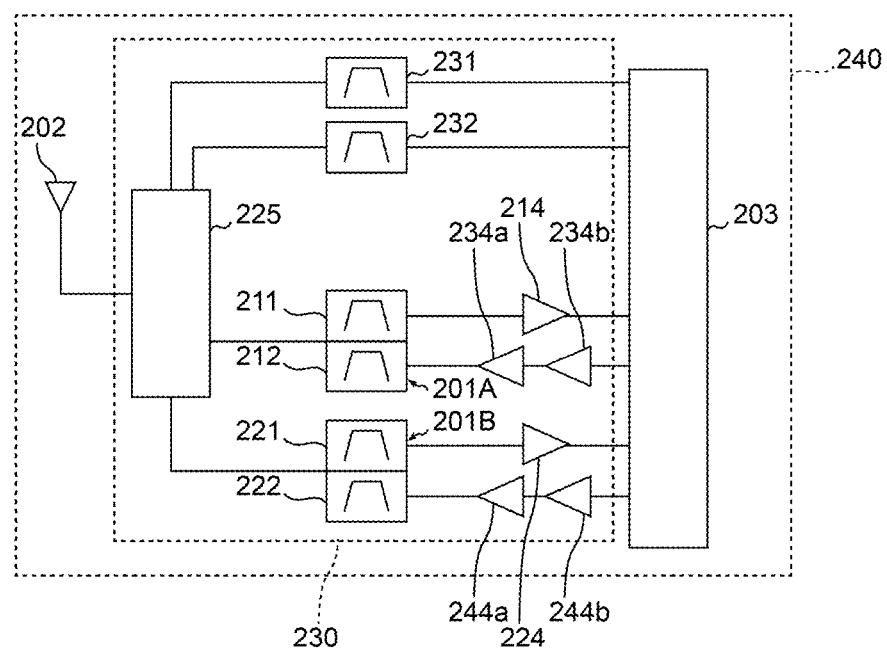
FIG. 14 is a diagram of a communication apparatus including an RF front-end circuit.

FIG. 14 is a diagram of a communication apparatus including an RF front-end circuit. Note that elements connected to an RF front-end circuit 230, such as an antenna element 202 and an RF signal processing circuit (RFIC) 203, are additionally illustrated in the diagram. The RF front-end circuit 230 and the RF signal processing circuit 203 define a communication apparatus 240. Note that the communication apparatus 240 may include a power source, a CPU, and a display.

The RF front-end circuit 230 includes a switch 225, duplexers 201A and 201B, filters 231 and 232, low-noise amplifier circuits 214 and 224, and power amplifier circuits 234a, 234b, 244a, and 244b. Note that the RF front-end circuit 230 and the communication apparatus 240 in FIG. 12 are only one example of an RF front-end circuit and a communication apparatus, and are not restricted to this configuration.

The duplexer 201A includes filters 211 and 212. The duplexer 201B includes filters 221 and 222. The duplexers 201A and 201B are connected to the antenna element 202 with the switch 225 interposed therebetween. Note that the above-described acoustic wave device may be the duplexer 201A or 201B, or may be the filter 211, 212, 221, or 222.

Furthermore, the above-described acoustic wave devices are applicable to a multiplexer with three or more filters, such as a triplexer with three filters having a common antenna terminal, or a hexaplexer with six filters having a common antenna terminal.

That is, the above-described acoustic wave devices include an acoustic wave resonator, a filter, a duplexer, and a multiplexer with three or more filters. The multiplexer is not restricted to a configuration provided with both a transmission filter and a reception filter, and may have a configuration that only has a transmission filter or a reception filter.

The switch 225 includes, for example, a SPDT (Single Pole Double Throw) switch, which connects the antenna element 202 and a signal path corresponding to a certain band in accordance with a control signal from a controller (not illustrated). Note that the number of signal paths connected to the antenna element 202 is not limited to one, but may be plural. In other words, the RF front-end circuit 230 may correspond to carrier aggregation.

The low-noise amplifier circuit 214 is a reception amplifier circuit that amplifies an RF signal (here, an RF reception signal) having gone through the antenna element 202, the switch 225, and the duplexer 201A and outputs the amplified signal to the RF signal processing circuit 203. The low-noise amplifier circuit 224 is a reception amplifier circuit that amplifies an RF signal (here, an RF reception signal) having gone through the antenna element 202, the switch 225, and the duplexer 201B and outputs the amplified signal to the RF signal processing circuit 203.

The power amplifier circuits 234a and 234b are transmission amplifier circuits that amplify an RF signal (here, an RF transmission signal) output from the RF signal processing circuit 203 and output the amplified signal to the antenna element 202 via the duplexer 201A and the switch 225. The power amplifier circuits 244a and 244b are transmission amplifier circuits that amplify an RF signal (here, an RF transmission signal) output from the RF signal processing circuit 203 and output the amplified signal to the antenna element 202 via the duplexer 201B and the switch 225.

The RF signal processing circuit 203 performs signal processing on an RF reception signal input from the antenna element 202 via a reception signal path by, for example, down-converting the RF reception signal, and outputs a reception signal generated by the signal processing. In addition, the RF signal processing circuit 203 performs signal processing on an input transmission signal by, for example, up-converting the input transmission signal, and outputs an RF transmission signal generated by the signal processing to the low-noise amplifier circuit 224. The RF signal processing circuit 203 is, for example, an RFIC. Note that the communication apparatus may include a BB (baseband) IC. In this case, the BBIC performs signal processing on a reception signal processed by the RFIC. In addition, the BBIC performs signal processing on a transmission signal, and outputs the processed transmission signal to the RFIC. A reception signal processed by the BBIC and a transmission signal before being subjected to signal processing by the BBIC are, for example, image signals and/or audio signals. Note that the RF front-end circuit 230 may include other circuit elements between the above-mentioned elements.

Note that the RF front-end circuit 230 may include duplexers according to modifications of the duplexers 201A and 201B, instead of the above-mentioned duplexers 201A and 201B.

In contrast, the filters 231 and 232 of the communication apparatus 240 are connected between the RF signal processing circuit 203 and the switch 225 without having the low-noise amplifier circuits 214 and 224 and the power amplifier circuits 234a, 234b, 244a, and 244b interposed therebetween. Like the duplexers 201A and 201B, the filters 231 and 232 are connected to the antenna element 202 with the switch 225 interposed therebetween.

According to the RF front-end circuit 230 and the communication apparatus 240 with the above configuration, the slope of acoustic velocity at the boundary between areas with different acoustic velocities is able to be made steeper and unnecessary waves are able to be effectively reduced or prevented by providing an acoustic wave resonator, a filter, a duplexer, or a multiplexer with three or more filters, which is an acoustic wave device according to a preferred embodiment of the present invention.

Although acoustic wave devices, RF front-end circuits, and communication apparatuses according to preferred embodiments of the present invention have been described with reference to the preferred embodiments and their modifications, the present invention includes other preferred embodiments realized by combining arbitrary elements in the above-described preferred embodiments and modifications, modifications obtained by applying various modifications conceivable to those skilled in the art to the above-described preferred embodiments without departing from the gist of the present invention, and various devices including the RF front-end circuit and the communication apparatus according to preferred embodiments of the present invention.

Preferred embodiments of the present invention can be widely used, in communication devices such as cellular phones, as an acoustic wave resonator, a filter, a duplexer, a multiplexer applicable to a multiband system, a front-end circuit, and a communication apparatus.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric substance; and
an IDT electrode provided on the piezoelectric substance; wherein
the IDT electrode includes:
a first busbar and a second busbar facing each other;
a plurality of first electrode fingers including first ends connected to the first busbar;
a plurality of second electrode fingers including first ends connected to the second busbar, the plurality of second electrode fingers being interdigitated with the plurality of first electrode fingers;
a crossing area where the first electrode fingers and the second electrode fingers overlap each other in an acoustic wave propagating direction; and
a first high-acoustic-velocity area and a second high-acoustic-velocity area;
the crossing area includes:
a central area positioned on a center side in a direction perpendicular or substantially perpendicular to the acoustic wave propagating direction; and
a first low-acoustic-velocity area and a second low-acoustic-velocity area located on both sides in a direction perpendicular or substantially perpendicular to the acoustic wave propagating direction of the central area, the first low-acoustic-velocity area and the second low-acoustic-velocity area having an acoustic velocity slower than that of the central area;
the first high-acoustic-velocity area is an area between the first busbar and the first low-acoustic-velocity area and has an acoustic velocity faster than that of the central area;
the second high-acoustic-velocity area is an area between the second busbar and the second low-acoustic-velocity area and has an acoustic velocity faster than that of the central area;
mass adding films are provided in respective portions of the plurality of first electrode fingers and the plurality of second electrode fingers in the first low-acoustic-velocity area and the second low-acoustic-velocity area;
assuming that a direction in which each of the first electrode fingers extends is each first length direction and a direction in which each of the second electrode fingers extends is each second length direction, each of the mass adding films incudes a central portion positioned at a center in the each first length direction or the each second length direction, and a first end portion and a second end portion positioned at both ends in the each first length direction or the each second length direction; and
assuming that a dimension along the acoustic wave propagating direction of the mass adding films is a width, a width of the first end portion and a width of the second end portion are narrower than a width of the central portion in at least one of the mass adding films, and the at least one of the mass adding films includes a protruding portion that protrudes from at least one of the first end portion and the second end portion to a side opposite to the piezoelectric substance side.

2. The acoustic wave device according to claim 1, wherein all of the mass adding films include the protruding portion.

3. The acoustic wave device according to claim 1, wherein the protruding portion is provided in both of the first end portion and the second end portion of the mass adding films.

4. An acoustic wave device comprising:
a piezoelectric substance; and
an IDT electrode provided on the piezoelectric substance; wherein
the IDT electrode includes:
a first busbar and a second busbar facing each other;
a plurality of first electrode fingers including first ends are connected to the first busbar;
a plurality of second electrode fingers including first ends are connected to the second busbar, the plurality of second electrode fingers being interdigitated with the plurality of first electrode fingers;
a crossing area where the first electrode fingers and the second electrode fingers overlap each other in an acoustic wave propagating direction;
a first high-acoustic-velocity area;
a second high-acoustic-velocity area;
the crossing area includes:
a central area positioned on a center side in a direction perpendicular or substantially perpendicular to the acoustic wave propagating direction; and
a first low-acoustic-velocity area and a second low-acoustic-velocity area arranged on both sides in a direction perpendicular or substantially perpendicular to the acoustic wave propagating direction of the central area, the first low-acoustic-velocity area and the second low-acoustic-velocity area having an acoustic velocity slower than that of the central area;
the first high-acoustic-velocity area is an area between the first busbar and the first low-acoustic-velocity area and has an acoustic velocity faster than that of the central area;
the second high-acoustic-velocity area is an area between the second busbar and the second low-acoustic-velocity area and has an acoustic velocity faster than that of the central area;
mass adding films are provided in respective portions of the plurality of first electrode fingers and the plurality of second electrode fingers in the first low-acoustic-velocity area and the second low-acoustic-velocity area;
assuming that a direction in which each of the first electrode fingers extends is each first length direction and a direction in which each of the second electrode fingers extends is each second length direction, each of the mass adding films incudes a central portion positioned at a center in the each first length direction or the each second length direction, a first end portion and a second end portion positioned at both ends in the each first length direction or the each second length direction, a first end surface that is an end surface positioned in the first end portion, and a second end surface that is an end surface positioned in the second end portion; and
the first end surface and the second end surface of at least one of the mass adding films are inclined with respect to a thickness direction of the mass adding films, and the at least one of the mass adding films includes a protruding portion that protrudes from at least one of the first end portion and the second end portion to a side opposite to the piezoelectric substance side.

5. The acoustic wave device according to claim 4, wherein, assuming that an angle of inclination with respect to the thickness direction of the mass adding films is an inclination angle, an inclination angle of the protruding portion is less than an inclination angle of an end surface positioned in one of the first end portion and the second end portion where the protruding portion protrudes.

6. The acoustic wave device according to claim 4, wherein all of the mass adding films include the protruding portion.

7. The acoustic wave device according to claim 4, wherein the protruding portion is provided in both of the first end portion and the second end portion of the mass adding films.

8. A radio-frequency front-end circuit comprising:
the acoustic wave device according to claim 1; and
a power amplifier.

9. A radio-frequency front-end circuit comprising:
the acoustic wave device according to claim 2; and
a power amplifier.

10. A radio-frequency front-end circuit comprising:
the acoustic wave device according to claim 3; and
a power amplifier.

11. A radio-frequency front-end circuit comprising:
the acoustic wave device according to claim 4; and
a power amplifier.

12. A radio-frequency front-end circuit comprising:
the acoustic wave device according to claim 5; and
a power amplifier.

13. A radio-frequency front-end circuit comprising:
the acoustic wave device according to claim 6; and
a power amplifier.

14. A radio-frequency front-end circuit comprising:
the acoustic wave device according to claim 7; and
a power amplifier.

15. A communication apparatus comprising:
the radio-frequency front-end circuit according to claim 8; and
an RF signal processing circuit.

16. A communication apparatus comprising:
the radio-frequency front-end circuit according to claim 9; and
an RF signal processing circuit.

17. A communication apparatus comprising:
the radio-frequency front-end circuit according to claim 10; and
an RF signal processing circuit.

18. A communication apparatus comprising:
the radio-frequency front-end circuit according to claim 11; and
an RF signal processing circuit.

19. A communication apparatus comprising:
the radio-frequency front-end circuit according to claim 12; and
an RF signal processing circuit.

20. A communication apparatus comprising:
the radio-frequency front-end circuit according to claim 13; and
an RF signal processing circuit.

* * * * *